United States Patent
Jiang et al.

(10) Patent No.: US 10,287,442 B2
(45) Date of Patent: May 14, 2019

(54) ELECTRICALLY CONDUCTIVE POLYMERIC COMPOSITIONS, CONTACTS, ASSEMBLIES, AND METHODS

(71) Applicant: Heraeus Precious Metals North America Conshohocken LLC, West Conshohocken, PA (US)

(72) Inventors: Hong Jiang, Irvine, CA (US); Aziz S. Shaikh, San Diego, CA (US)

(73) Assignee: HERAEUS PRECIOUS METALS NORTH AMERICA CONSHOHOCKEN LLC, West Conshohocken, PA (US)

( * ) Notice: Subject to any disclaimer, the term of this patent is extended or adjusted under 35 U.S.C. 154(b) by 310 days.

(21) Appl. No.: 14/363,120

(22) PCT Filed: Dec. 13, 2012

(86) PCT No.: PCT/US2012/069368
§ 371 (c)(1),
(2) Date: Jun. 5, 2014

(87) PCT Pub. No.: WO2013/090498
PCT Pub. Date: Jun. 20, 2013

(65) Prior Publication Data
US 2014/0332071 A1 Nov. 13, 2014

Related U.S. Application Data

(60) Provisional application No. 61/569,889, filed on Dec. 13, 2011, provisional application No. 61/569,853, filed on Dec. 13, 2011.

(51) Int. Cl.
*C09D 5/24* (2006.01)
*C09D 151/08* (2006.01)
(Continued)

(52) U.S. Cl.
CPC ............ *C09D 5/24* (2013.01); *C08F 290/064* (2013.01); *C08G 18/673* (2013.01);
(Continued)

(58) Field of Classification Search
CPC ................ H01L 31/022425–31/022458; H01L 2224/03502; H01L 2224/03515;
(Continued)

(56) References Cited

U.S. PATENT DOCUMENTS 4,695,404 A * 9/1987 Kwong .................... H01B 1/22
106/1.19
5,476,688 A 12/1995 Ostolski
(Continued)

FOREIGN PATENT DOCUMENTS

EP 2269195 1/2011
JP S62-164757 A 7/1987
(Continued)

*Primary Examiner* — Eric R Smith
(74) *Attorney, Agent, or Firm* — Blank Rome LLP

(57) ABSTRACT

Electrically conductive polymeric compositions adapted for use in forming electronic devices are disclosed. The compositions are thermally curable at temperatures less than about 250° C. Compositions are provided which may be solvent-free and so can be used in processing or manufacturing operations without solvent recovery concerns. Core-shell conductive particles provide the conductivity of the compositions and devices contemplated herein.

11 Claims, 2 Drawing Sheets

(51) Int. Cl.

| | | |
|---|---|---|
| *C09D 175/16* | (2006.01) | |
| *H01L 31/0376* | (2006.01) | |
| *H01L 31/0224* | (2006.01) | |
| *H01L 31/18* | (2006.01) | |
| *C08G 18/80* | (2006.01) | |
| *C08G 18/67* | (2006.01) | |
| *C08F 290/06* | (2006.01) | |
| *H01B 1/22* | (2006.01) | |
| *H01B 1/02* | (2006.01) | |
| *C08K 9/10* | (2006.01) | |
| *C08F 222/10* | (2006.01) | |

(52) U.S. Cl.
CPC .......... *C08G 18/8093* (2013.01); *C08K 9/10* (2013.01); *C09D 151/08* (2013.01); *C09D 175/16* (2013.01); *H01B 1/02* (2013.01); *H01B 1/22* (2013.01); *H01L 31/022425* (2013.01); *H01L 31/1884* (2013.01); *C08K 2201/001* (2013.01); *H01L 31/03762* (2013.01); *Y02E 10/50* (2013.01)

(58) Field of Classification Search
CPC ... H01L 2224/0519; H01L 2224/05191; H01L 2224/05399–2224/05484; H01L 2224/1356–2224/13563; H01L 2224/2956–2224/29564; H05K 1/092–1/097; C09D 11/52; C09D 5/24; B22F 1/00–1/025; H01B 1/20; H01B 1/22
See application file for complete search history.

(56) References Cited

U.S. PATENT DOCUMENTS

| | | | |
|---|---|---|---|
| 5,707,554 A | 1/1998 | Bennett et al. | |
| 5,855,820 A * | 1/1999 | Chan | C09D 5/24 |
| | | | 252/511 |
| 6,013,203 A * | 1/2000 | Paneccasio, Jr. | C09D 5/24 |
| | | | 252/512 |
| 2002/0062990 A1 * | 5/2002 | Kikuchi | H05K 3/4069 |
| | | | 174/264 |
| 2003/0006066 A1 | 1/2003 | Appelt et al. | |
| 2005/0034560 A1 * | 2/2005 | Kuwajima | B22F 1/0003 |
| | | | 75/255 |
| 2005/0109990 A1 | 5/2005 | Yeager et al. | |
| 2007/0146941 A1 | 6/2007 | Edwin et al. | |
| 2007/0164260 A1 * | 7/2007 | Kuwajima | H01B 1/02 |
| | | | 252/512 |
| 2008/0057233 A1 * | 3/2008 | Harrison | B41M 5/3825 |
| | | | 428/32.74 |
| 2008/0131685 A1 * | 6/2008 | Lee | H01B 1/22 |
| | | | 428/327 |
| 2008/0169122 A1 * | 7/2008 | Shiraishi | C09D 11/52 |
| | | | 174/257 |
| 2008/0261049 A1 | 10/2008 | Hayashi et al. | |
| 2009/0280326 A1 | 11/2009 | Giesenberg et al. | |
| 2010/0001237 A1 * | 1/2010 | Fornes | B22F 1/0059 |
| | | | 252/500 |
| 2010/0096014 A1 * | 4/2010 | Iida | H01B 1/16 |
| | | | 136/265 |
| 2010/0186823 A1 * | 7/2010 | Hsu | H01B 1/22 |
| | | | 136/263 |
| 2011/0129673 A1 * | 6/2011 | Gupta | H01B 1/20 |
| | | | 428/403 |
| 2012/0119163 A1 | 5/2012 | Dorfman | |
| 2012/0261171 A1 | 10/2012 | Yamada et al. | |
| 2012/0305065 A1 * | 12/2012 | Dorfman | H01B 1/22 |
| | | | 136/256 |

FOREIGN PATENT DOCUMENTS

| | | |
|---|---|---|
| JP | H-1201485 | 8/1989 |
| JP | 2006161081 A | 6/2006 |
| JP | 2006183110 A | 7/2006 |
| JP | 2014-503614 A | 2/2014 |
| WO | WO-90/02406 A1 | 3/1990 |
| WO | WO-00/11681 A1 | 3/2000 |
| WO | WO-2005031760 | 4/2005 |
| WO | WO 2010/048387 | 4/2010 |

\* cited by examiner

ELECTRICALLY CONDUCTIVE POLYMERIC COMPOSITIONS, CONTACTS, ASSEMBLIES, AND METHODS

CROSS REFERENCES TO RELATED APPLICATIONS

This application claims priority upon U.S. Provisional Application Ser. Nos. 61/569,853 and 61/569,889 both filed 13 Dec. 2011, herein incorporated by reference.

FIELD OF THE INVENTION

The present invention relates to electrically conductive polymeric compositions that can be cured at low temperatures using core-shell conductive particles. The compositions can be used in a wide range of electronic assemblies such as solar cells. The invention also relates to the resulting assemblies and related methods of use.

BACKGROUND OF THE INVENTION

Electrically conductive polymeric compositions are well known and have a wide variety of applications. These compositions can be used to form electrically conductive films and patterns in electronic devices for example. An example of such an application is the use of a paste in manufacturing photovoltaic cells. Silver electrodes having low contact resistance can be formed from these conductive compositions. However, silver paste used for making photovoltaic cells based on crystalline silicon, requires high temperatures for curing, such as firing temperatures greater than 700° C. This is problematic for certain devices, since many electronic devices should not be exposed to such high temperatures. For example, when forming solar cells having a Si:H layer, processing temperatures must not exceed 250° C., so as to not degrade the heat sensitive material. Thus, many known electrically conductive compositions can not be used for such applications. The high electrical conductivity is another requirement in applications, such as solar cells to achieve high efficiency. Therefore, it would be desirable to provide highly electrically conductive compositions that can be thermally cured at relatively low temperatures, such as less than 250° C.

SUMMARY OF THE INVENTION

The difficulties and drawbacks associated with known systems are overcome in the present invention.

Broadly, this invention features curable conductive polymeric composition comprising conductive particles, such as Silver (Ag), Gold (Au), Nickel (Ni), metal coated particles, such as Ag coated Copper (Cu), Ag coated Ni, and their use as bus bars for solar cells.

Typically, silver pastes used for making back bus bars for crystalline silicon photovoltaic cells require high temperature firing to make direct contact to Si wafer surface, which reduces BSF (back surface field) coverage and breaks the continuity of BSF. Full back coverage of Al is desirable due to better BSF coverage leading to higher cell efficiency. This is made possible by using low temperature curable, conductive pastes as back bus bars, which are printed on top of the fired Al and subsequently cured at 250° C. or less.

This concept also applies to cells with non-fired Aluminum (Al) back contacts such as those with silicon nitride passivation. Since the inventive compositions are curable at 250° C. or less, they do not fire through the passivation layer, which preserves the integrity and quality of the passivation.

In one aspect, the invention provides an electrically conductive, thermally curable composition comprising (a) an effective amount of electrically conductive particles, the particles comprising a core and a shell; and (b) an effective amount of a curable polymer composition capable of being cured at 250° C. or less.

In another aspect, the invention provides a method of forming an electrically conductive layer on a substrate, the method comprising; (a) forming a composition comprising (i) an effective amount of electrically conductive particles, the particles comprising a core and a shell; (ii) an effective amount of a curable polymer composition capable of being cured at 250° C. or less; (b) applying the composition on a substrate to a thickness of from about 1 to about 100 microns; and (c) heating the applied composition to a temperature less than 250° C. to form an electrically conductive layer. A free radical initiator may optionally be included.

In still another aspect, the invention provides a substrate having a thin layer of an electrically conductive polymeric material, the material including from about 70 wt % to about 92 wt % electrically conductive particles dispersed in an effective amount of a polymer matrix formed from thermally curing a curable polymer composition capable of being cured at 250° C. or less, the particles comprising a core and a shell.

In yet another aspect, the invention provides a photovoltaic device comprising a plurality of layers, and an electrically conductive member, the electrically conductive member formed from a composition comprising (a) an effective amount of electrically conductive particles, and (b) an effective amount of a polymer matrix formed from thermally curing a curable polymer composition capable of being cured at 250° C. or less, the particles comprising a core and a shell.

A layered assembly comprising: (a) a substrate; (b) a layer of a transparent conducting oxide on the substrate; and (c) an electrically conductive member in electrical communication with the layer of transparent conducting oxide, the electrically conductive member formed from a composition comprising: (i) an effective amount of electrically conductive particles, the particles comprising a core and a shell, and (ii) an effective amount of a polymer matrix formed from thermally curing a curable polymer composition capable of being cured at 250° C. or less.

Yet another aspect of the invention is a solar cell comprising: (a) a p-type silicon substrate having an n-emitter disposed on a first side thereof, (b) an Al containing back contact layer disposed on a second side thereof, (c) a passivation layer disposed over the n-emitter, (d) front silver-based contacts disposed on, or fired through, at least a portion of the passivation layer, (e) a plurality of polymer based conductive bus bars disposed on the Al containing back contact layer, the polymer based conductive bus bars comprising an electrically conductive, thermally curable composition comprising: (i) an effective amount of electrically conductive particles, the particles comprising a core and a shell; and (ii) an effective amount of a curable polymer composition capable of being cured at 250° C. or less An aspect of the invention is a solar cell comprising: (a) an n-type silicon substrate having an n$^+$ emitter disposed on a first side thereof, (b) a p$^+$ Al—Si containing back contact layer disposed on a second side thereof, (c) a passivation layer disposed over the emitter, (d) front silver-based contacts disposed on, or fired through, at least a portion of the passivation layer, (e) a plurality of polymer based conductive bus bars disposed on back contact layer, the polymer based conductive bus bars comprising: an electrically conductive, thermally curable composition comprising: (i) electrically conductive particles, the particles comprising a core and a shell; and (ii) an effective amount of a curable polymer composition capable of being cured at 250° C. or less.

In yet another aspect, a solar cell of the invention comprises (a) an aluminum back contact, and (b) at least one bus bar disposed on the back contact, said busbar contact, formed by curing, at a temperature of 250° C. or less, a conductive composition comprising conductive metal particles and a curable polymer composition capable of being cured at 250° C. or less.

As will be realized, the invention is capable of other and different embodiments and its several details are capable of modifications in various respects, all without departing from the invention. Accordingly, the description is to be regarded as illustrative and not restrictive.

DESCRIPTION OF THE PREFERRED EMBODIMENTS

Figure 1:
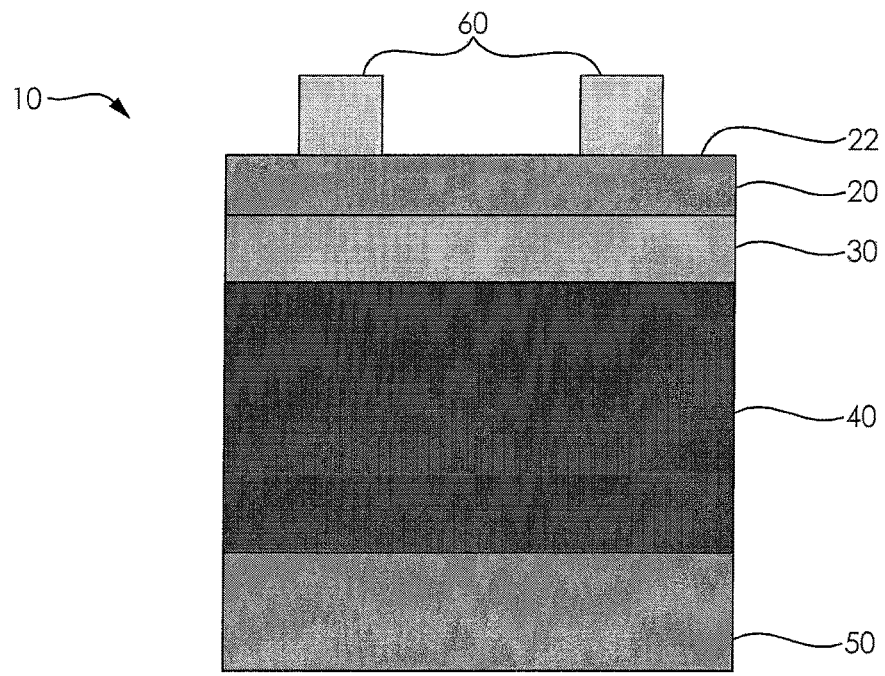
FIG. 1 is a schematic cross sectional view of a representative preferred embodiment layered assembly having contacts formed from the compositions described herein.

The present invention provides an electrically conductive, low temperature thermally curable polymeric composition that can be used in numerous applications, such as those where processing temperatures must not exceed 250° C. In certain versions of the invention, the compositions are solvent-free. The invention also provides methods of forming electrically conductive films, circuits, traces, contacts and the like using the inventive compositions. The invention includes devices, products and/or coated substrates formed using the inventive compositions and methods.

The invention allows the conductive Ag electrodes to be formed at temperatures lower than 250° C. The paste is heat curable at temperatures greater than 70° C., but lower than 250° C. in 10 minutes or less. Besides thin film solar cells, this invention can also be used on other heat sensitive substrate surfaces as well.

Solar cells, or photovoltaic cells, are a main application of the invention. The three key elements of a photovoltaic cell are the semiconductor which absorbs photons and converts them into excitons, the semiconductor junction which splits excitons into electrons and holes, and the contacts on the front and back of the device which allow current to flow to the external circuit. The semiconductor material has traditionally defined the type of photovoltaic, thus the various technologies include photovoltaics made from crystalline silicon, photovoltaics made from thin film semiconductors, and photovoltaics made using completely or partially organic semiconductors.

Crystalline silicon. Crystalline Si photovoltaics include all photovoltaic devices using silicon as the semiconductor, except for those using thin films of amorphous silicon. They include poly/multi-crystalline Si, mono/single-crystal Si, and ribbon-grown Si. Crystalline silicon was the first semiconductor material to be used in a practical photovoltaic cell and has always dominated the global photovoltaic market.

For crystalline photovoltaics, the semiconductor homojunction is generally formed by doping n-type phosphorus into the top surface of p-type boron doped silicon. Printed contacts are then applied to the top and bottom of the cell, with the top (front) contact being specially designed to facilitate light absorption, usually by application of an antireflective coating (ARC).

The current PV market is dominated by solar cells based on mono- and polycrystalline silicon wafers. The corresponding process technologies have been developed together with the microelectronics industry. However an essential difference between solar cells and microelectronics lies in scalability. While transistors get cheaper and faster when getting smaller, solar cells cannot decrease in size because large areas are required in order to harvest the sunlight. Increasing the number of devices per area has no positive effect in photovoltaics. Instead the efficiency of the device has to be increased which is naturally attempted in all solar cell concepts but is limited to about 30% for an energy gap of 1.1 eV.

Crystalline Si has various advantages and disadvantages relative to other classes of photovoltaics. Crystalline Si photovoltaics are stable relative to amorphous Si thin film photovoltaics. Crystalline Si photovoltaics generally operate with good power conversion efficiencies, in the range of 11-16%. Disadvantages include relatively poor photon absorption efficiency of crystalline Si, which requires a thicker layer of semiconductor (on the order of several hundred microns).

Manufacturing of crystalline Si photovoltaic modules includes four major processes: crystal growth, wafer slicing, cell processing and module manufacturing.

Thin Film Photovoltaics. High cost and relatively poor light absorption associated with crystalline photovoltaics led to the development of thin film semiconductor materials, materials which absorb light so well that only a thin film of about one micron is needed. The materials include amorphous silicon, CdTe, and CuInGaSe$_2$ (also known as CIGS). The semiconductor junctions in thin film photovoltaics are either P-I-N junctions for amorphous Si or bulk heterojunctions for CdTe and CIGS. A transparent conducting oxide (TCO) is used as the front contact, and metal is used as the back contact.

Thin film photovoltaics are suited to high volume manufacturing: thin film devices can be continuously printed roll-to-roll on sheets of either coated polymer, glass or stainless steel. Adequate power conversion efficiencies are achievable: above 13% in laboratory testing, and average module efficiencies of 5-8%. Unfortunately, power conversion degrades over time.

Thin film photovoltaics have been developed with the aim of reducing the amount of material and hence the cost, of the photovoltaic cell. The thickness of the wafer based cells is limited by the mechanical stability during wafer handling. Transferring the mechanical stability issue to inexpensive substrates like glass enables the use of much thinner films. Besides PV applications, thin films are also attractive for large area electronic devices like displays and sensors. The homogeneous deposition of thin films on glass substrates on very large scale has already been developed by the glass industry for various applications like mirrors, toned glass etc. Thin film deposition using these technologies permits material cost savings. Additionally, in wafer based modules the solar cells have to be interconnected with extra connection strips. Assembly of connection strips is labor-intensive and sensitive to failure. The advantage of large-area devices on foreign substrates like glass is that interconnections can be realized by monolithic integration of solar cells. This leads to totally new concepts for solar module design offering a high potential to reduce cost limits in PV.

One main challenge when using inexpensive substrates like glass is the limitation in process temperatures. Typical glasses have strain points at about 600° C. That means all process steps must be below this margin. Si wafers can be handled at much higher temperatures because of the high melting point of Si at 1414° C. In order to realize thin film technologies at low temperatures different material systems have been investigated. Compound semiconductors like copper indium diselenide (CIS) and cadmium telluride (CdTe) are promising candidates. Silicon is particularly attractive due to its abundance and non-toxicity. Hydrogenated amorphous silicon (a-Si:H) thin films deposited by plasma enhanced chemical vapor deposition (PECVD) achieved partial success. At present it is the only thin film technology which has overcome the barrier to mass production. But it has not been able to replace wafer based technologies so far and has market share below 10%. For low-power applications (e.g. watches and calculators) amorphous silicon solar cells are established as dominant technology. They suffer from lower efficiencies due to their poorer electronic properties compared to crystalline wafer material and degradation (Staebler-Wronski-effect). Consequently the fabrication of silicon thin-films with improved electronic properties has attracted researchers' interest. Microcrystalline silicon ($\mu$c-Si—H) can be deposited at temperatures below 200° C. Solar cell efficiencies of above 10% have been obtained. On $\mu$c-Si:H/a-Si:H tandem solar cell modules of sizes up to 450 mm×910 mm, initial efficiencies of 13.5% have been obtained. In hybrid technologies combining advantages of polycrystalline and a-Si, such as in HIT cells, efficiencies of ~20-23% can be realized. HIT cells are an application where the inventive pastes can be applied. It is believed that fine-crystalline silicon structures are limited in their perspective compared to polycrystalline Si wafer material. In order to minimize recombination at grain boundaries a large grain size is desirable.

Ideally a large grained silicon thin film should be formed on a foreign inexpensive substrate, like glass. Large grained can be defined as laterally larger than the layer thickness. In this case the efficiency is limited by the recombination at the front and back contacts. This is hoped to yield efficiencies comparable with silicon wafers at much lower cost. Due to the softening point of glasses at around 600° C. the silicon thin films have to be formed at low temperatures.

A photovoltaic device of the invention may include a one or a plurality of layers of amorphous silicon, crystalline silicon, copper indium gallium diselenide, a P-N diode, or a P-I-N diode. Aluminum may also be included in the layers. Due to the high melting point of silicon, crystallization of amorphous silicon at temperatures below the glass softening point is a solid phase reaction. It has been found that metals in contact with amorphous silicon reduce crystallization time and temperature. Also, the resulting Si grain size can be increased. Unfortunately metal impurities in the resulting crystalline silicon can lead to very high doping levels (e.g. in case of Al). Due to the resulting high recombination rates crystalline silicon from metal induced crystallization (MIC) is not suitable for absorber layers. But due to the large grain sizes such layers can be used as templates for subsequent epitaxial thickening at low temperatures. To do so a continuous smooth layer of crystallized silicon is needed. A process known as aluminum induced layer exchange (ALILE) has been developed. In this process an aluminum and amorphous silicon bi-layer on a glass substrate exchange their position with a concurrent crystallization of the silicon. The resulting polycrystalline silicon layer is smooth, continuous and features large grains (>10 $\mu$m) with a preferential (100) orientation. Thus ALILE layers are eligible as a template (seed layer) for subsequent low temperature epitaxy.

The major components of the invention may include electrically conductive particles, a curable polymeric composition, ethylenically unsaturated monomers or oligomers, blocked isocyanates, reactive diluents, solvents, free radical initiators, catalysts, and additives.

Electrically Conductive Particles. The composition also comprises electrically conductive particles, and preferably particles that are at least partially metallic.

The electrically conductive particles may have a single-metal structure or have a core-shell structure. Whether used as a single metal or the core of a core-shell particle, the useful metals herein include silver, gold, platinum, palladium, copper, and nickel. Broadly, a core-shell particle will have a less conductive core covered by a more conductive coating or shell. Alternately, a less noble metal core is covered by more noble metal coating or shell. Ag coated Cu or Ag coated Cu alloys, or Ag coated Ni or Ag coated Ni alloys are good examples. They offer cost benefit as well as better leach resistance than Ag particles. Moreover, more noble metal coating improves the oxidation resistance of the less noble metal.

In a core-shell particle, the core is envisioned to be made of a composition selected from the group consisting of nickel, nickel alloys, copper, copper alloys, non-noble transition metals, alloys of non-noble transition metals, polymers, silica, alumina, glass, graphite and combinations thereof. Single-metal particles can be envisioned, indirectly in the case where the core and shell are the same metal. In a preferred embodiment, the core is copper and the shell is silver.

In particular, the core-shell particles of the invention may be silver coated nickel particles, silver coated copper particles, silver coated polymer particles, silver coated silica particles, silver coated alumina particles, silver coated glass particles, silver coated graphite particles, gold coated nickel particles, gold coated copper particles, gold coated polymer particles, gold coated silica particles, gold coated alumina particles, gold coated glass particles, gold coated graphite particles, platinum coated nickel particles, platinum coated copper particles, platinum coated polymer particles, platinum coated silica particles, platinum coated alumina particles, platinum coated glass particles, platinum coated graphite particles, palladium coated nickel particles, palladium coated copper particles, palladium coated polymer particles, palladium coated silica particles, palladium coated alumina particles, palladium coated glass particles, palladium coated graphite particles, and combinations thereof.

The composition of the invention may include metallic particles at a concentration of from about 70 wt % to about 92 wt %, preferably about 75 to about 85 wt %, more preferably about 84 to about 86 wt %, and still more preferably about 85 wt %.

In one embodiment, a core-shell particle, the core accounts for about 70 to about 98 wt % of the particle, preferably about 80 to about 98 wt %, more preferably about 85 to about 91 wt %. The shell accounts for about 2 to about 20 wt % of the particle, preferably about 5 to about 20 wt %, more preferably about 9 to about 15 wt %.

While as indicated above, a wide array of metals may be used, in view of its excellent properties, silver is preferred. The metal particles can be in a range of different forms, such as flakes or particles. For many applications, flakes are preferred. Particles useful herein, whether flakes or roughly spheroidal or other shaped particles, have $D_{50}$ sizes in the range of from about 0.01 microns to about 50 microns, preferably about 0.1 micron to about 20 microns preferably from about 3 microns to about 20 microns, and more preferably about 2 microns to about 10 microns.

In an alternate embodiment, conductive particulates having elongated shapes such as flakes with lengths of up to approximately 20 microns and thicknesses of approximately 2 microns or less are used. The elongation of these particulates is represented by their aspect ratio, which is the ratio of the dimension of the particle along the longest axis to the dimension of the particle along a lateral or orthogonal axis. The conductivity of polymeric compositions in accordance with the present invention generally increases with the aspect ratio of the conductive particulates.

In certain embodiments, the metal particles have a surface area of 0.2-5 $m^2/g$, preferably 0.5-2 $m^2/g$. In certain embodiments, the metallic particles have a tap density of 0.1-6 glee, preferably 2.5-4.5 g/cc. Illustrative of the conductive metallic materials employed in the present invention are, for example, silver flakes which are available, from Ferro Corporation or Degussa Metz Metallurgical Corporation.

Curable Polymeric Composition. The polymer composition includes components selected from the group consisting of thermoplastics, polyolefins, polypropylene, polyethylene, polystyrene, polycarbonates, polyesters, polyurethanes, polyvinyl acetates, polyamides, polyimides, polyurea, cellulose, thermosets, acrylates, epoxies, isocyanates, blocked isocyanates, polyesters, and combinations thereof.

In one embodiment the polymer composition may include an ethylenically unsaturated monomer or oligomer with hydroxyl groups, and a blocked isocyanate with unblocking temperatures below 200° C.

Ethylenically unsaturated monomer or oligomer. The ethylenically unsaturated monomer or oligomers useful herein include hydroxyl groups. Such are selected from the group consisting of fatty acid modified polyester(meth)acrylate monomer(s) or oligomer(s), 2-hydroxyethyl(meth)acrylate, 2-hydroxypropyl(meth)acrylate, 4-hydroxybutyl(meth)acrylate, glycerol mono(meth)acrylate, N-(2-hydroxypropyl)(meth)acrylamide, pentaerythritol triacrylate, hydroxyethoxy allyl ether. Other useful ethylenically unsaturated monomers or oligomers broadly include "epoxy (meth)acrylate monomers or oligomers, which include monomers or oligomers formed from an epoxy resin and one or more acrylates/methacrylates (or acrylic or methacrylic acid). Thus, the term "epoxy acrylate oligomer" includes a wide range of material classes such as, but not limited to, aromatic difunctional epoxy acrylates and methacrylates, novolac epoxy acrylates and methacrylates, acrylated oil epoxy acrylates and methacrylates, aliphatic epoxy acrylates and methacrylates, and specialty epoxy oligomers containing acrylates and/or methacrylates. The monomers and/or oligomers may include exclusively acrylates or exclusively methacrylates, or may include both acrylates and methacrylates. An example of an aromatic difunctional epoxy acrylate is bisphenol A diglycidyl ether based epoxy acrylates. Preferably, the epoxy acrylate and/or methacrylate oligomers used in the preferred embodiment compositions described herein do not have any free epoxy groups left. However, it will be appreciated that the epoxy acrylate and/or methacrylate oligomers used may include a proportion of unreacted epoxy groups. Preferably, the proportion of unreacted epoxy groups is less than 30% and more preferably less than 10%.

The term "oligomer" as used herein generally refers to a polymer or corresponding structure having a number average molecular weight of from about 250 to about 20,000, and preferably from about 500 to about 10,000.

The epoxy acrylates and/or methacrylates described herein typically have a functionality of 10 or less with 1 to 8 being preferred and 2 to 6 being most preferred.

Blocked isocyanates. The compositions of the invention include blocked isocyanates. The isocyanate is blocked in order to prevent reaction below a certain temperature, called the unblocking temperature, at which the blocking group is removed and the icocyanate may react. Useful blocked isocyanates include isocyanate modified epoxy(meth)acrylate monomer(s) or oligomer(s), malonate blocked aliphatic isocyanates, malonate blocked aromatic isocyanates, pyrazole blocked aliphatic isocyanates, pyrazole blocked aromatic isocyanates, caprolactam blocked aliphatic isocyanates, caprolactam blocked aromatic isocyanates, oxime blocked aliphatic isocyanates, oxime blocked aromatic isocyanates, and combinations thereof. In a preferred embodiment, the blocked isocyanate is aliphatic. The blocked isocyanates may be used at a concentration of from about 0.1 wt % to about 10 wt %, preferably about 0.5 to about 5 wt % and more preferably about 1 to about 4 wt %. Taken together, the combination of (i) ethylenically unsaturated monomer or oligomer with hydroxyl groups and (ii) blocked isocyanate are used at a concentration of from about 0.1% to about 30%.

Fatty Acid modified (meth)acrylates. The preferred embodiment compositions of the present invention comprise particular epoxy acrylate and/or methacrylate oligomers which include one or more fatty acids. Thus, these fatty acid-containing oligomers are referred to herein as "fatty acid modified epoxy acrylate or methacrylate oligomers." The fatty acid modified epoxy acrylate oligomers are typically formed by reacting an epoxy resin with a mixture of acrylates and/or methacrylates (or acrylic acid and/or methacrylic acid) and one or more fatty acids. The fatty acid group(s) substitute the acrylate and/or methacrylate group(s). Most preferably, the epoxy acrylate or methacrylate oligomers are fatty acid modified acrylate or methacrylate epoxy oligomers having a functionality of 2 to 6. The fatty acid modified epoxy acrylates and/or methacrylates can be in the form of monomers, selectively polymerized to form oligomers, or combinations of monomers and oligomers. In certain optional versions of the preferred embodiments, a combination of fatty acid modified epoxy diacrylate oligomers and epoxy triacrylate oligomers are used. This particular combination has been discovered to provide remarkably high levels of electrical conductivity. Both solvent-free and solvent-containing compositions exhibit high electrical conductivity using the particular fatty acid modified epoxy acrylates.

A wide range of fatty acids can be used in the preferred fatty acid modified epoxy acrylate oligomers. For example, the hydrocarbon chain length of the fatty acid group may vary from 10 to 30 carbons, and typically is in the range of from 12 to 18. The fatty acids can be either saturated or unsaturated. Moreover, it is also contemplated that dimer fatty acids can also be incorporated into the fatty acid modified epoxy acrylate or methacrylate oligomers.

Preferably, the fatty acid modified diacrylate epoxy oligomer is commercially available under the designation Genomer 2259 available from Rahn USA. Examples of other preferred commercially available fatty acid modified diacrylate epoxy oligomers include, but are not limited to Genomer 2255, also available from Rahn USA. Genomer 2255 and 2259 are modified bisphenol A epoxy acrylates. Genomer 2255 is modified to a lesser degree than 2259. Genomer 2259 is believed to be a lauric acid modified epoxy acrylate with an average functionality of 2. The epoxy diacrylate oligomer can be used in any amount that results in an increase in electrical conductivity, and hence can be used in an "effective concentration." An effective concentration for the fatty acid modified epoxy acrylate and/or methacrylate monomer(s) or oligomer(s) is typically, a concentration of from about 0.1% to about 30% (all percentages expressed herein are percentages by weight based upon the composition prior to curing, unless expressed otherwise).

Additional examples of preferred commercially available epoxy oligomers include, but are not limited to, CN113D70 and CN2101. These are both available from Sartomer Company. CN113D70 is a fatty acid modified trifunctional epoxy acrylate, and is believed to be a modified epoxy novolac acrylate with 30% SR9020, propoxylated glycerol triacrylate. CN113D70 has a glass transition temperature (Tg) of 51° C. CN2101 is a fatty acid modified epoxy acrylate. CN2101 has a glass transition temperature (Tg) of 63° C. CN2101 is supplied as a mixture of epoxy acrylate oligomer and acrylic esters.

The optional epoxy triacrylate oligomer is aliphatic and preferably CN133 available from Sartomer Company, Inc. CN133 is believed to be trimethylolpropanol and/or glycerol glycidyl ether based epoxy acrylate, and broadly is considered a trifunctional aliphatic epoxy acrylate. CN133 has a glass transition temperature (Tg) of 60° C. It is used primarily to increase curing speed. The epoxy triacrylate oligomer, if used, is preferably used at a concentration of from about 0.1% to about 25%.

In addition to, or instead of, the fatty acid modified epoxy acrylates and/or methacrylates, the present invention may include the incorporation of fatty acid modified polyester acrylates and/or methacrylates. When used in combination, the fatty acid modified polyester acrylates and/or methacrylates can be used in nearly any proportion to the fatty acid modified epoxy acrylates and/or methacrylates. The fatty acid modified polyester acrylates or methacrylates are formed by reacting one or more polyols with a mixture of polycarboxylic acids, acrylic and/or methacrylic acid, and fatty acids. The fatty acids are as previously described. Acrylic and/or methacrylic acid are known to those skilled in the art. And, polycarboxylic acids are generally compounds containing two or more carboxylic acid groups. An example of a polycarboxylic acid is dicarboxylic acid having two —COOH groups. Generally, the functionality of the polycarboxyl component is from 2 to 10, and preferably 2 to 6. The polyol component can be selected from nearly any polyol known in the art. An effective concentration for the fatty acid modified polyester acrylate and/or methacrylate monomer(s) or oligomer(s) is typically a concentration of from about 0.1% to about 30%. As noted, the inventive compositions may use a combination of fatty acid modified epoxy acrylate and/or methacrylate monomer(s) or oligomer(s), and fatty acid modified polyester acrylate and/or methacrylate monomer(s) or oligomer(s). When using a combination of these classes of fatty acid modified components, their total concentration is from about 0.1% to about 30%.

The fatty acid modified polyester acrylate can be obtained commercially such as from Rahn USA under the designation Genomer 3611. Genomer 3611 is believed to be a hexafunctional polyester acrylate oligomer with stearate end groups.

Reactive Diluent. The present invention composition may also optionally comprise an effective amount of a reactive diluent. An example of such a reactive diluent when using the noted combination of a diacrylate epoxy oligomer and a triacrylate epoxy oligomer, is hexane diol diacrylate. Hexane diol diacrylate is available from Rahn USA Corp under the designation Miramer M200. Other reactive diluents may be used. An example of an effective amount is a concentration of from about 1% to about 10%, more preferably from about 2% to about 8%, more preferably from about 2 wt % to about 7 wt %. A concentration of about 4% to about 7% is most preferred. It will be understood however, that in certain applications, it may not be necessary to use a reactive diluent if for example, the viscosity of the resulting composition, prior to curing, is suitable and compatible for the subsequent processing and application operations.

Free Radical Initiator. The inventive compositions also comprise one or more free radical initiators, such as for example 2,5-dimethyl-2,5-di(t-butylperoxy)-3-hexyne which is available from Sigma Aldrich. Other free radical initiators, such as dicumyl peroxide, dibenzoyl peroxide, 1,1-di(t-amylperoxy)cyclohexane, similar agents, and combinations thereof may be used. It will be appreciated that in no way is the present invention or its preferred embodiments limited to these particular free radical initiators. It is contemplated that nearly any organic peroxide selected to be compatible with the components of the composition and the curing conditions can be used. Moreover, it is also contemplated that for certain applications it may be possible to use other types of free radical initiators such as halogen molecules and/or azo compounds. The selected free radical initiator(s) is used at a concentration generally effective to initiate polymerization of the system. Such concentrations are typically from about 0.01 wt % to about 2 wt %, preferably about 0.05 wt % to 1.5 wt % more preferably about 0.1 to about 1 wt %, with 0.3% being preferred.

Urethane catalyst. A urethane catalyst is useful to assist in the liberation of isocyanate groups in order that they may react with hydroxyl groups to form urethane linkage Useful urethane catalysts include dibutyltin dilaurate, dibutyltin dilauryl mercaptide, cobalt bis(2-ethyl hexanoate), bismuth tris(2-ethyl hexanoate), tertiary amines, dimethylcyclohexylamine, organometallic compounds, bismuth octanoate, 1,4-diazabicyclo[2.2.2]octane (also called DABCO or TEDA), bis-(2-dimethylaminoethyl)ether, potassium octoate, and combinations thereof.

The urethane catalyst may be used in an amount of about 0.01 to about 5 wt %, preferably about 0.05 to about 3 wt %, more preferably about 0.1 to about 1 wt %.

Solvent. While solvent-free applications are suitable, a solvent is occasionally advantageous. Useful solvents include glycol ethers, diethylene glycol monobutyl ether, glycol ether esters, diethylene glycol monobutyl ether acetate, dimethyl ester of adipic acid, dimethyl ester of glutaric acid, and dimethyl ester of succinic acid, terpene alcohol, ester alcohols, texanol, water, xylene, DOWANOL PMA (Propylene Glycol Methyl Ether Acetate), DPGME (dipropylene glycol methyl ether), butyl acetate, $C_9$ aromatics, ethyltoluenes, trimethylbenzenes, and combinations thereof.

A wide array of other additives, components, and/or agents can be added or otherwise incorporated in the inventive compositions. For example, various wetting agents, defoamers and viscosity adjusting additives can be added. For example, BYK® 321, available commercially from BYK USA of Wallingford, Conn., can be used as a wetting agent. BYK® 321 is believed to be a polyether modified methylalkylpolysiloxane copolymer.

The present invention composition is preferably formed by combining the free radical initiator with the reactive diluent followed by the addition of the epoxy acrylate oligomers, which as noted are preferably the epoxy diacrylate oligomer and the epoxy triacrylate oligomer. The intermediate mixture is thoroughly mixed until a homogenous resin mixture is obtained. The electrically conductive metallic particulate which is preferably silver flakes, is then added followed by further mixing and optional milling.

Coated substrates, layered arrays, or devices for example using the present invention composition can be prepared by applying the composition in a desired region and to a desired thickness, and then curing the composition. Application of the composition can be preferred in numerous fashions, however screen printing is preferred. As will be appreciated by those skilled in the art, a wide array of patterns can be applied to form various contacts, traces, circuits and/or other electrically conductive regions.

Film or coating thicknesses may vary, but from about 1 to about 100 microns is typical, from about 10 to about 70 microns is preferred, with from about 15 to about 50 microns being most preferred for many applications.

As noted, the preferred embodiment compositions are thermally curable at relatively low temperatures, such as less than 250° C. Typical curing parameters utilize temperatures of about 140° C. to 200° C. for times of from about 5 seconds to about 20 minutes, with about 10 minutes being preferred. In certain embodiments, temperatures up to 200° C. may be used. It is contemplated that curing times as long as 60 minutes or longer could be utilized Curing and heating are preferably performed in air. However, it is contemplated that for many applications, curing may be performed in inert gas atmospheres.

It is also contemplated that the present invention compositions can be cured by exposure to UV radiation, upon incorporation of an effective amount of a UV cure agent instead of the previously noted initiator.

In certain applications, the present invention and the preferred embodiment compositions can be provided and used in a solvent-free state. As previously noted, solvents, and particularly hydrocarbon-based solvents, can be undesirable due to associated solvent removal and recovery equipment and operations. Thus, it is generally preferred that the compositions are solvent-free. However, the present invention includes compositions containing solvent, such as ethylene glycol ethers and acetates, for example n-butyl diethylene glycol, or which are mixed or otherwise combined with solvents.

The present invention also provides electrical assemblies such as photovoltaic devices such as solar cells utilizing the inventive compositions described herein. The term "photovoltaic device" as used herein refers to a device that converts light into electricity, and preferably, directly into direct current (dc) electricity. The compositions can be used to form electrically conductive contacts, busbars, pads, attachment tabs, and similar components on or in conjunction with the layered assemblies, and in particular with solar cells.

Solar cells are generally made of semiconductor materials, such as silicon (Si), which convert sunlight into useful electrical energy. Solar cells are, in general, made of thin wafers of Si in which the required PN junction is formed by diffusing phosphorus (P) from a suitable phosphorus source into a P-type Si wafer. The side of silicon wafer on which sunlight is incident is in general coated with an anti-reflective coating (ARC) to prevent reflective loss of incoming sunlight, and thus to increase the efficiency of the solar cell. A two dimensional electrode grid pattern known as a front contact makes a connection to the N-side of silicon, and a coating of aluminum (Al) on the other side (back contact) makes connection to the P-side of the silicon. These contacts are the electrical outlets from the PN junction to the outside load.

FIG. 1 illustrates a preferred embodiment assembly 10 in accordance with the present invention. The assembly 10 comprises a layer of a semiconductor material 40 such as copper indium gallium (di)selenide (CIGS) disposed between an upper layer 30 such as an optoelectronic layer which may for example be a layer of a cadmium sulfide (CdS) photoresistor, and a lower layer 50 which may be a back contact formed from a metal such as molybdenum. Disposed on the upper layer 30 is a layer 20 of a transparent conducting oxide (TCO) which may for example be formed from indium tin oxide (ITO) or other suitable materials known in the art. The top surface of the TCO layer defines an upper face 22. One or more electrical contacts 60 or other conductive components are disposed on the layered assembly. The contacts 60 are formed from the inventive compositions described herein.

Figure 2:
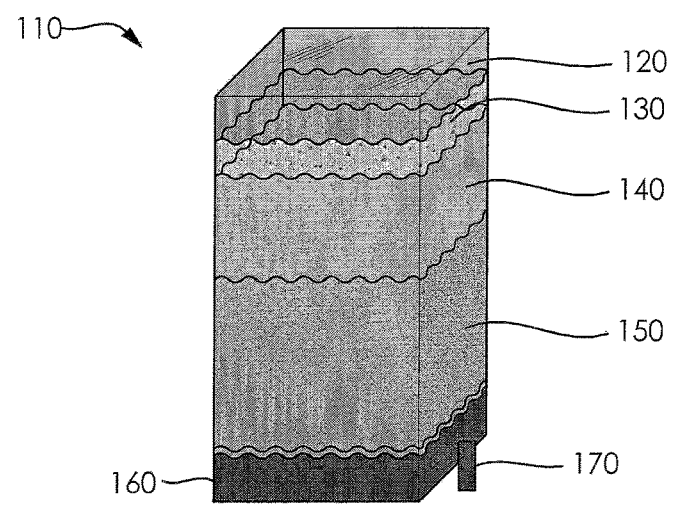
FIG. 2 is a schematic cross sectional view of another representative preferred embodiment layered assembly having an attachment tab formed from the compositions described herein.

FIG. 2 illustrates another preferred embodiment assembly 110 in accordance with the present invention. The assembly 110 comprises an at least substantially transparent top substrate 120, which may for example be formed from glass. One or more layers of a transparent conductor 130 are preferably positioned between the top substrate 120 and an amorphous silicon layer 140. Disposed between the amorphous silicon layer 140 and a back contact layer 160 is a layer of microcrystalline silicon 150. One or more electrical components such as an attachment tab 170 can be incorporated into the assembly 110 such as the tab 170 that is in electrical communication with the back contact 160. The attachment tab 170 is formed from the inventive compositions described herein.

Figure 3:
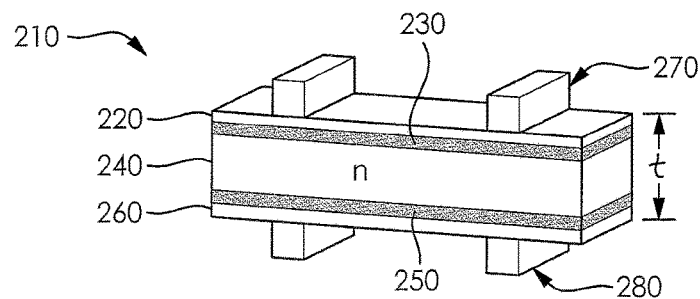
FIG. 3 is a schematic perspective view of a representative preferred solar cell utilizing upper and lower busbars formed from the compositions described herein.

FIG. 3 illustrates yet another preferred embodiment assembly 210 in accordance with the present invention. The assembly 210 is generally in the form of a solar cell and comprises an intermediate layer 240 which is for example an n-type semiconductor material. Disposed on one face of the intermediate layer 240 is a p-type/i-type material layer 230 which can for example be a thin amorphous silicon layer. Disposed on an opposite face of the intermediate layer 240 is an i-type/n-type material layer 250 which can for example be a thin amorphous silicon layer. Disposed on the layer 230 is a front side electrode layer 220. And, disposed on the layer 250 is a rear side electrode layer 260. The assembly 210 further comprises one or more electrically conductive components such as busbars 270 disposed on the front side electrode 220. The assembly 210 can further comprise one or more electrically conductive components such as busbars 280 disposed on the rear side electrode 260. The various electrically conductive components, e.g. the busbars 270 and 280, are formed from the compositions described herein. The thickness of the assembly 210 is relatively thin. For example, the total thickness of the collection of layers 220, 230, 240, 250, and 260 is from about 100 μm to about 400 μm, and typically about 200 μm.

Figure 4:
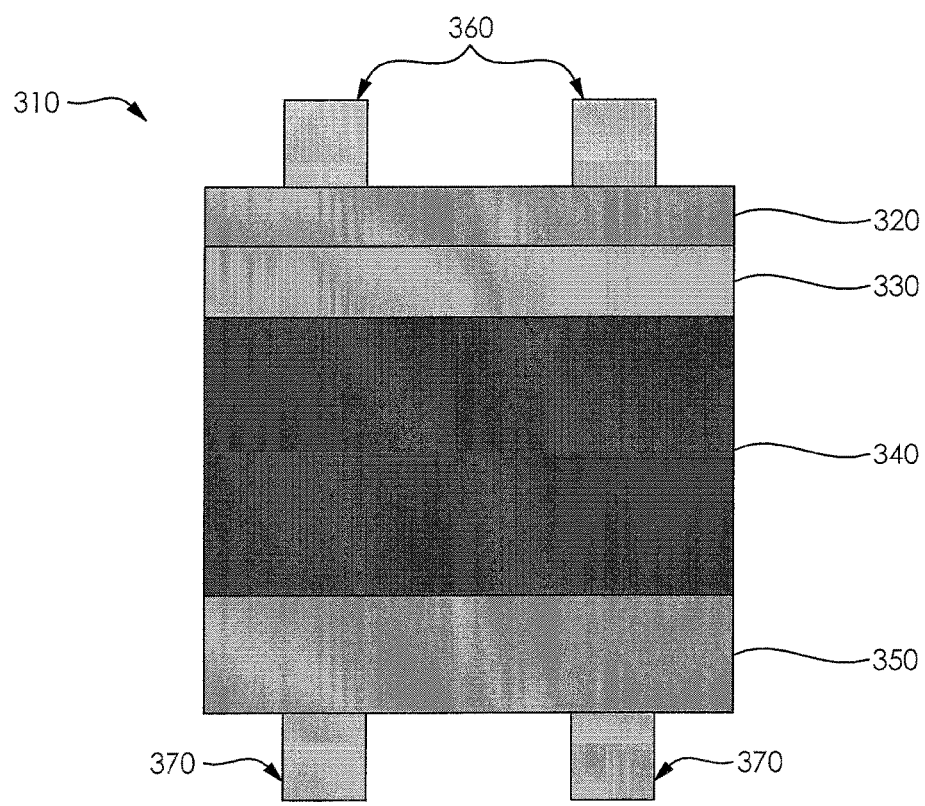
FIG. 4 is a schematic cross sectional view of another representative preferred embodiment layered assembly having a lower busbar formed from the compositions described herein.

FIG. 4 illustrates another preferred embodiment assembly 310 in accordance with the present invention. The assembly 310 may for example be in the form of a polycrystalline and a monocrystalline silicon cell comprising an intermediate layer 340 of a p-type silicon material disposed alongside a layer 330 of an n-emitter material. A top layer 320 of a silicon nitride material and a bottom layer 350 constituting a back contact layer formed of aluminum for example are included in the cell 310. One or more contacts 360 are provided along the top or front face of layer 320. And one or more electrically conductive busbars 370 are provided along the bottom or rear contact layer 350. The busbars 370 are formed from the inventive compositions. It is also contemplated that the contacts 360 could also be formed from the inventive compositions. It is also envisioned that the conductive polymeric compositions of the invention can be injected or otherwise caused to flow into and through vias previously formed (not shown) through the silicon wafer in order to contact the P-N junction. The conductive polymeric compositions can also be caused to contact the front silver contact by printing on top of previously fired fingers.

The present invention compositions find particular use in conjunction with a photovoltaic device comprising amorphous or crystalline silicon; and/or a photovoltaic device comprising a CIGS material. The present invention compositions can also be used as a backside conductor on top of an aluminum conductor layer in a crystalline silicon solar cell. In addition, the present invention compositions can be used to form contacts having low electrical resistance on (i) transparent conductors such as ITO on substrates and (ii) aluminum on silicon substrates.

The present invention also provides a strategy for achieving a particular or desired electrical conductivity characteristic by selectively curing the inventive compositions described herein. That is, by following one or more designated curing profiles, electrical components such as contacts, busbars, tabs and the like, can be formed having particular electrical conductivity levels. After preparation of a preferred embodiment composition, the composition is cured at a desired temperature and for a desired time period to achieve a desired electrical resistivity characteristic of the resulting cured composition. Generally, by heating at higher temperatures, the extent of curing increases and the resistivity of the resulting cured compositions decreases. Although not wishing to be bound to any particular theory, it is contemplated that increasing the time period of curing will also produce cured compositions having reduced resistivity values. However, as explained in greater detail herein, it is believed that as curing temperature (and extent of curing) is increased, the resistivity of the resulting cured composition will reach some minimum value.

Using the inventive compositions, various layered assemblies can be formed with electrically conductive members that exhibit remarkably low contact resistivities. For example, layered assemblies having electrical contacts formed from the preferred embodiment compositions can be prepared in which the electrically conductive contact, after curing, exhibits a contact resistivity of less than 20, preferably less than 10, more preferably less than, and most preferably less than 1 ohm·cm². The electrically conductive member will also exhibit a volume resistivity of less than 100, preferably less than 90, more preferably less than 75 and most preferably less than 50 milliohm/square/mil.

EXAMPLES

A series of investigations were conducted to further assess the nature of the present invention. A composition (in weight %) of the paste of the present invention with Ag coated Cu as described in Example 1 was prepared as described herein, and is set forth below in Table 1.

One example of the composition (in weight %) of the paste of the present invention with Ag coated Cu is as follows:

TABLE 1

| Components | Example 1 |
| --- | --- |
| Hexane diol diacrylate | 3.53 |
| Genomer 2259 (Rahn USA Corp) | 1.56 |
| CN133 (Sartomer Company, Inc.) | 5.20 |
| Dicumyl Peroxide (Sigma Aldrich) | 0.10 |
| Butyl carbitol | 5.41 |
| Ag coated Cu flake (Ferro Corp) | 84.20 |

Hexane diol diacrylate is from Rahn AG under the trade name Miramer M200. Genomer 2259 is from Rahn AG and is a fatty acid modified epoxy acrylate oligomer with 2 acrylate functionality CN133 is from Sartomer Co., Inc. and is an epoxy acrylate oligomer with three acrylate functionality. Dicumyl Peroxide is purchased from Sigma Aldrich and is a free radical initiator. Ag coated Cu flake is from Ferro Corporation, South Plainfield, N.J. The peroxide is first mixed in with hexane diol diacrylate, followed by the addition of Genomer 2259, CN133. The above constituents are mixed thoroughly until a homogeneous resin mixture is obtained. Conductive fillers are added to the resin mixture, followed by mixing and milling.

Sample preparation for resistivity measurement is as follows: The paste is screen-printed onto a glass substrate with a film thickness of 15-20 microns, followed by curing at 200° C. in air for 10 minutes.

The electrical conductivity of Example 1 is set forth in Table 2:

TABLE 2

|  | Example 1 |
| --- | --- |
| Bulk resistivity (ohm · cm) | 0.00011 |

Ag coated Cu gives excellent electrical conductivity. It is printable and curable at temperature between 180° C. to 200° C. for 10 minutes to 30 minutes.

The following data, in Table 3, is an example of solar cells using Ag filled polymeric paste as back bus bars. The electrical data, were taken before and after the polymeric bus bars were in place.

TABLE 3

| Wafers | Jsc | Isc | Voc | FF | EFF |
| --- | --- | --- | --- | --- | --- |
| Wafer1 before | 0.03682 | 8.6806 | 0.640 | 0.7685 | 18.109 |
| Wafer 1 after | 0.03792 | 8.9394 | 0.642 | 0.7743 | 18.841 |
| Wafer 2 before | 0.03694 | 8.7092 | 0.645 | 0.7586 | 18.077 |
| Wafer 2 after | 0.03797 | 8.9523 | 0.645 | 0.7647 | 18.7352 |

As shown above electrical properties are improved after polymeric bus bars are cured in place.

It will be appreciated that the present invention enables the photovoltaic cells to achieve higher efficiency by forming BSF over the entire back surface. For back passivated cell designs, since it is curable at 250° C. or less, the paste of the present invention does not damage the passivation layer and therefore, it preserves the passivation quality.

Also, the coated conductive particles of the present invention offer a low cost solution with better leach resistance. A paste system may also be made UV curable by using a photo initiator in place of the thermal initiator.

Additional aspects and details of known electrically conductive polymeric compositions which may be applicable to the present invention are provided in U.S. Pat. Nos. 4,999,136; 5,514,729; 6,071,437; 6,713,000; 7,157,507; and 7,323,499; and Patent Publications 2008/0114089; and 2008/0178930.

Additional details and description concerning compositions, electrical assemblies such as solar cells, contacts, and related components and methods are provided in U.S. patent application Ser. No. 11/145,538 filed Jun. 3, 2005, published as US 2006/0289055; and U.S. patent application Ser. No. 10/988,208 filed Nov. 11, 2004, published as US 2006/0102228.

Many other benefits will no doubt become apparent from future application and development of this technology. All patents, published applications, and articles noted herein are hereby incorporated by reference in their entirety.

As described hereinabove, the present invention solves many problems associated with previous type devices. However, it will be appreciated that various changes in the details, materials and formulations, which have been herein described and illustrated in order to explain the nature of the invention, may be made by those skilled in the art without departing from the principle and scope of the invention, as expressed in the appended claims.

What is claimed is:

1. An electrically conductive, thermally curable composition comprising:
   a. 70 to 92 wt %, based upon weight of the composition, of electrically conductive particles comprising metallic particles, the metallic particles comprising a copper core and a silver shell, having a flake shape with a length of up to about 20 μm and a thickness of up to about 2 μm, and having a tap density of 2.5-4.5 g/cm$^3$; and
   b. a thermally curable polymer composition capable of being cured at 250° C. or less, wherein the curable polymer composition is solvent-free, the curable polymer composition comprising:
      i) an ethylenically unsaturated monomer or oligomer with hydroxyl groups; and
      ii) a blocked isocyanate with an unblocking temperature below 200° C.

2. The composition of claim 1, wherein the copper core accounts for about 80 to about 98 wt % of each of the metallic particles, and the silver shell accounts for about 2 to about 20 wt % of each of the metallic particles.

3. The composition of claim 1, wherein the core accounts for about 85 to about 91 wt % of each of the metallic particles, and the shell accounts for about 9 to about 15 wt % of each of the metallic particles.

4. The composition of claim 1, wherein the electrically conductive particles have a $d_{50}$ particle size of from about 2 microns to about 10 microns.

5. The composition of claim 1, wherein the metallic particles have a surface area of 0.2-5 m$^2$/g.

6. The composition of claim 5, wherein the metallic particles have a surface area of 0.5-2 m$^2$/g.

7. The composition of claim 1, wherein the ethylenically unsaturated monomer or oligomer is a fatty acid modified epoxy acrylate monomer or a fatty acid modified epoxy acrylate oligomer.

8. The composition of claim 1, further comprising a reactive diluent and a free radical initiator.

9. The composition of claim 8, wherein the reactive diluent is hexane diol diacrylate.

10. The composition of claim 1, wherein the electrically conductive particles are used at a concentration of about 84 to about 86 wt %.

11. A method of forming an electrically conductive layer on a substrate, the method comprising;
   a. forming a composition comprising:
      i. an effective amount of electrically conductive particles, the electrically conductive particles comprising metallic particles, the metallic particles comprising a copper core and a silver shell, having a flake shape with a length of up to about 20 μm and a thickness of up to about 2 μm, and having a tap density of 2.5-4.5 g/cm$^3$;
      ii. a thermally curable polymer composition capable of being cured at 250° C. or less, the curable polymer composition comprising:
         an ethylenically unsaturated monomer or oligomer with hydroxyl groups; and
         a blocked isocyanate with an unblocking temperature below 200° C.; and
   b. applying the composition on a substrate to a thickness of from about 1 to about 100 microns; and
   c. heating the applied composition to a temperature less than 250° C. to form an electrically conductive layer.

* * * * *